United States Patent [19]

Kitagawa et al.

[11] Patent Number: 5,210,601
[45] Date of Patent: May 11, 1993

[54] COMPRESSION CONTACTED SEMICONDUCTOR DEVICE AND METHOD FOR MAKING OF THE SAME

[75] Inventors: Mitsuhiko Kitagawa; Yoshio Yokota, both of Tokyo; Kazuo Watanuki, deceased, late of Yokohama, all of Japan, by Tetsu Watanuki, heir

[73] Assignee: Kabushiki Kaisha Toshiba, Kawasaki, Japan

[21] Appl. No.: 817,952

[22] Filed: Jan. 6, 1992

Related U.S. Application Data

[63] Continuation of Ser. No. 604,501, Oct. 29, 1990, abandoned.

[30] Foreign Application Priority Data

Oct. 31, 1989 [JP] Japan ............................. 1-283736

[51] Int. Cl.$^5$ ...................... H01L 27/02; H01L 23/32
[52] U.S. Cl. ..................................... 257/727; 257/618
[58] Field of Search ............................. 357/79, 55

[56] References Cited

U.S. PATENT DOCUMENTS

| | | | |
|---|---|---|---|
| 4,156,963 | 6/1979 | Tsuji et al. | 357/79 |
| 4,399,452 | 8/1983 | Nakashima et al. | 357/79 |
| 4,620,211 | 10/1986 | Baliga et al. | 357/38 |
| 4,775,916 | 10/1988 | Kouzuchi et al. | 357/79 |
| 4,791,465 | 12/1988 | Sakai et al. | 357/55 |
| 4,996,586 | 2/1991 | Matsuda et al. | 357/79 |

FOREIGN PATENT DOCUMENTS

| | | |
|---|---|---|
| 56-42391 | 4/1981 | Japan. |
| 58-71658 | 4/1983 | Japan. |
| 58-169972 | 10/1983 | Japan. |
| 63-205958 | 8/1988 | Japan. |
| WO87/01866 | 3/1987 | PCT Int'l Appl. |
| 1124176 | 8/1968 | United Kingdom. |

OTHER PUBLICATIONS

A. Mogro-Campero, et al., "Temperature Behavior and Annealing of Insulated Gate Transistors Subjected to Localized Lifetime Control by Proton Implantation," Solid-State Electronics, vol. 30, No. 2, Feb. 1987, pp. 185-188.
L. Marechal, "Designing with the COMFET," New Electronics, vol. 16, No. 20, Oct. 1983, pp. 71 and 73-74.

Primary Examiner—Eugene R. LaRoche
Assistant Examiner—Viet Q. Nguyen
Attorney, Agent, or Firm—Finnegan, Henderson, Farabow, Garrett & Dunner

[57] ABSTRACT

According to this invention, a compression contacted semiconductor device is characterized by including a semiconductor pellet having main electrodes formed a first major surface of one surface side and a second major surface of another surface side, and electrode posts arranged on at least one major surface of the semiconductor pellet through an electrode member to sandwich the semiconductor pellet to compress the electrodes of the first and second major surfaces, wherein a crystal defect density is distributed within a surface of the semiconductor pellet so that a carrier lifetime of at least heat generating portions in the surface of the semiconductor pellet which do not sufficiently conduct heat to the electrode posts is shorter than a carrier lifetime of major heat generating portions which sufficiently conduct heat to the electrode posts. For this reason, current in the heat generating portions which do not sufficiently conduct heat to the electrode members is decreased. Therefore, the amount of heat generation is reduced, and the break-down voltage of a semiconductor element is increased.

12 Claims, 11 Drawing Sheets

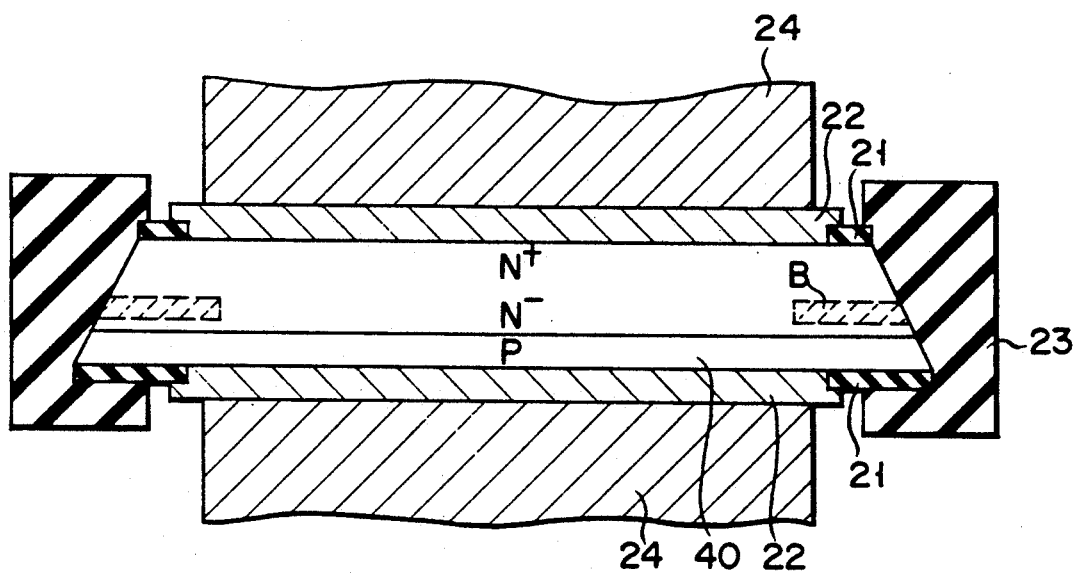
F I G. 4
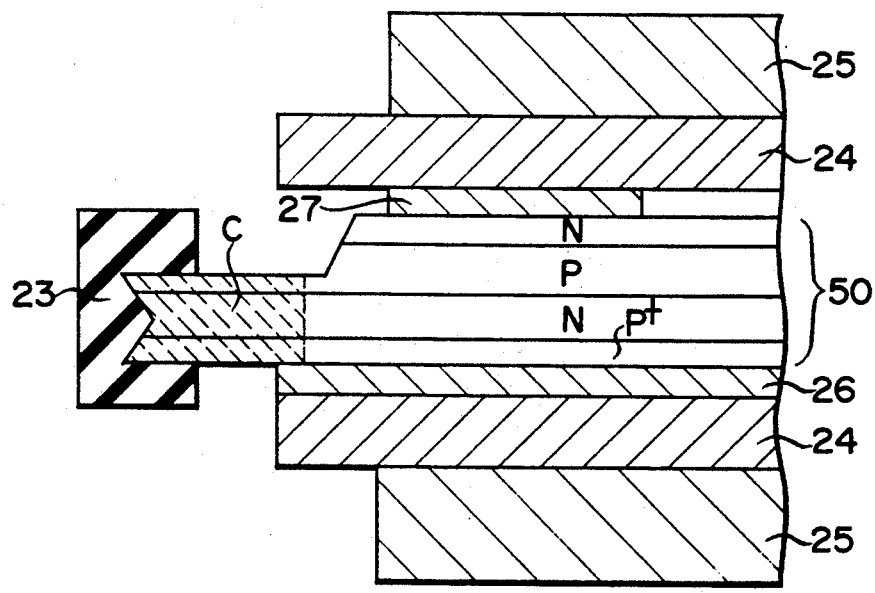
F I G. 5

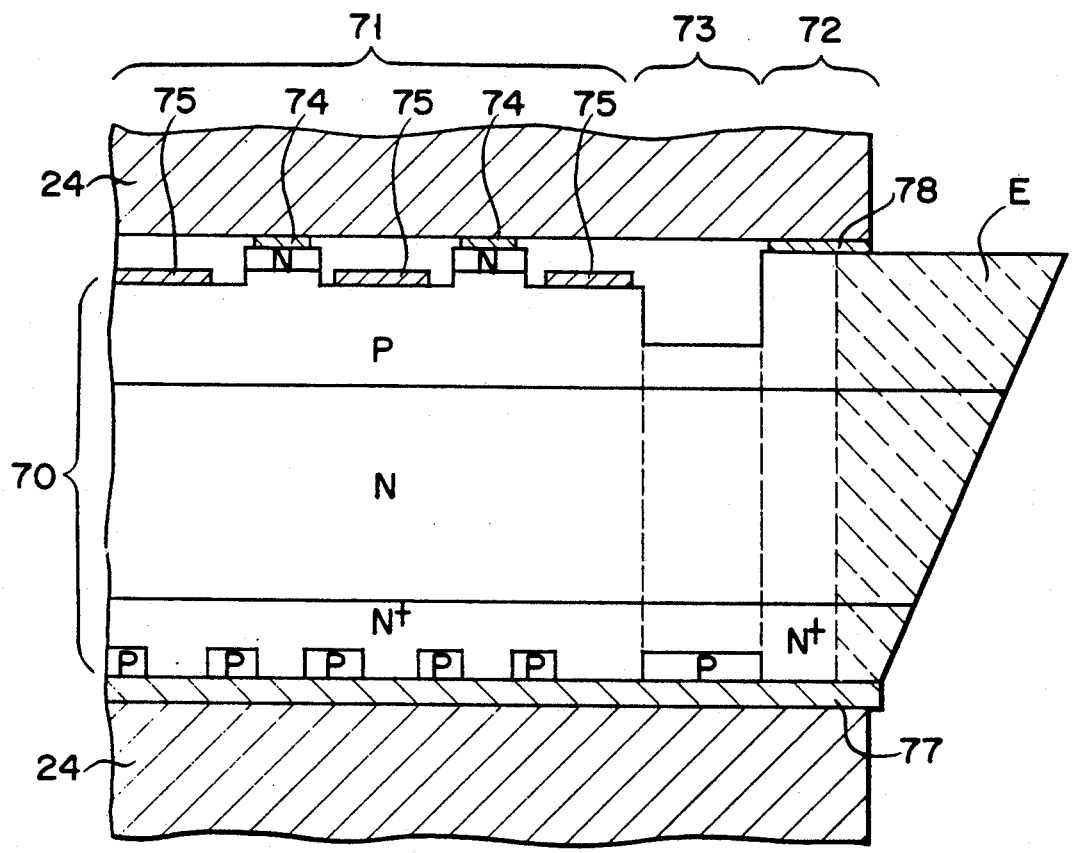
F I G. 7A

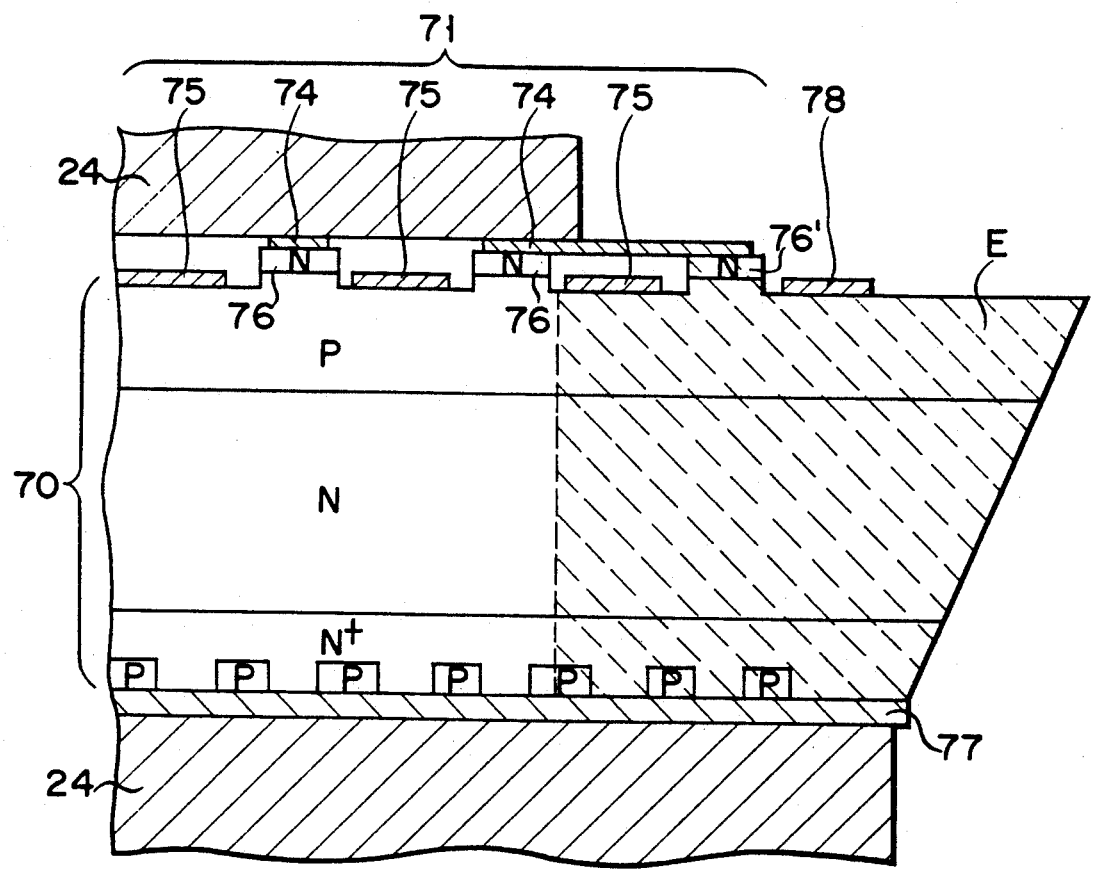
F I G. 7B

COMPRESSION CONTACTED SEMICONDUCTOR DEVICE AND METHOD FOR MAKING OF THE SAME

This application is a continuation, of application Ser. No. 07/604,501 filed Oct. 29, 1990 now abandoned.

BACKGROUND OF THE INVENTION

1. Field of the Invention

The present invention relates to a power semiconductor device and, more particularly, to a compression bonded semiconductor device in which a breakdown voltage of the semiconductor device is increased.

2. Description of the Related Art

In a conventional power semiconductor device, in order to satisfy conditions such as heat dissipation, current capacity, breakdown resistance, and a diameter of a semiconductor pellet, a compression bonded package such as a stud or flat package is used. However, since a special junction edge region such as a beveled structure is used as a junction structure of the semiconductor pellet to obtain a higher breakdown voltage, it is difficult to compress the pellet to contact all surfaces of portions which generate heat during operation. According to the above compression bonded package, in the surface of the semiconductor pellet which generates heat, heat dissipation of a portion with which a compression bonded electrode is in tight contact is excellent, but heat dissipation of a portion with which the compression bonded electrode is not in contact is very poor.

In a conventional compression bonded semiconductor device using such a compression bonded package, as countermeasures to heat dissipation, the area of a portion where an external electrode is in contact with a semiconductor pellet is maximized, or a heat buffer plate made of molybdenum (Mo), tungsten (W), or the like, which has a thermal expansion coefficient close to that of the semiconductor pellet (silicon pellet) is fixed on one surface of the semiconductor pellet through an Al-Si alloy film.

Even when the above structures are used, heat dissipation of a portion with which an external electrode is not in contact is poor, and a semiconductor element may be destroyed.

FIGS. 1A and 1B schematically show a conventional alloy compression bonded diode and a conventional alloy free compression bonded diode, respectively. In FIGS. 1A and 1B, reference numeral 10 denotes a semiconductor pellet (silicon pellet) on which a p-n junction diode is formed, and main electrodes are formed on one (first) major surface and the other (second) major surface, respectively. An encapsulating member (e.g., silicone rubber) 11 is provided to cover the edge surface portion of the semiconductor pellet 10.

In the alloy structure shown in FIG. 1A, one surface of the semiconductor pellet 10 is fixed on a heat buffer plate (e.g., Mo) 12 by alloy bonding, and an electrode member 13 is arranged on the other surface of the semiconductor pellet 10. The semiconductor pellet 10 is compressed from both the sides by electrode posts (e.g., Cu) 14.

In the alloy-free structure shown in FIG. 1B, electrode posts 14 compress the electrode members 13, which in turn compress the the two electrodes 13 formed on the first and second major surfaces of the semiconductor pellet 10, respectively. The pellet 10 is compressed between the electrode members 13, but not fastened thereto. Both electrode member 13 are compressed between the pellet 10 and the electrode post 14, but are not fixed to the pellet 10 or the post 14.

Although portions of edge regions which are not covered with the electrodes 13 of the semiconductor pellets 10 shown in FIGS. 1A and 1B and which are indicated by arrows a (portions of the surfaces of the semiconductor pellets 10 with which external electrodes are not in contact) generate heat during an operation time, the portions have poor heat dissipation. For this reason, when the semiconductor pellet 10 is a diode, the edge region which is not covered with the electrode 13 and which is indicated by the arrow a is easily destroyed by a back power at a reverse recovery time.

As has been described above, according to a conventional compression bonded semiconductor device, a portion with which an external electrode is not in contact within the surface of a semiconductor pellet has poor heat dissipation, and the breakdown voltage of a semiconductor element is decreased.

SUMMARY OF THE INVENTION

It is therefore an object of the present invention to provide a compression bonded semiconductor device in which an amount of heat generation from a portion within a surface of a semiconductor pellet which does not sufficiently conduct heat to an external electrode is reduced.

It is another object of the present invention to provide a compression bonded semiconductor device in which a breakdown voltage of a semiconductor element is increased.

These objects of the present invention will be achieved in the following device.

There is provided a compression bonded semiconductor device comprising main electrodes formed on a first major surface of one surface side and a second major surface of the other surface side of a semiconductor pellet having at least one junction portion, an electrode member arranged on at least one major surface of the semiconductor pellet, thus forming a layered unit along with the pellet, and at least a pair of electrode posts sandwiching the layered unit, thus compressing the electrodes formed on each major surface of the pellet; wherein a crystal defect density is distributed within a surface of the semiconductor pellet so that a carrier life time of heat generating portions in the surface of said semiconductor pellet which do not sufficiently conduct heat to the electrode members is shorter than a carrier life time of major heat generating portions within the surface of the semiconductor pellet which sufficiently conduct heat to said electrode members.

It is another object of the present invention to provide a method of making a pellet in which a crystal defect density is distributed within a surface of the semiconductor pellet so that a carrier life time of at least heat generating portions on a pellet surface which do not sufficiently conduct heat to the electrode members is shorter than a carrier life time of heat generating portions on the pellet surface which sufficiently conduct heat to the electrode members.

This object of the present invention will be achieved in the following method.

There is provided a method of partially controlling a carrier life time of a semiconductor pellet comprising the steps of: forming a semiconductor pellet having a carrier life time substantially corresponding to predetermined electric characteristics of a semiconductor element by uniformly applying radiation onto an entire surface of the semiconductor pellet; selectively forming a mask on the semiconductor pellet except at a surface from which heat is not sufficiently conducted to electrode members; applying the radiation onto a surface of the semiconductor pellet on which the mask is not formed to decrease a carrier life time of the surface; and removing the mask from the semiconductor pellet.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a sectional view showing a main part of a modification of the compression bonded diode in FIG. 2;

FIG. 5 is a sectional view showing a part of an alloy free reverse blocking GTO thyristor in which a carrier life time is partially controlled by electron beam radiation;

FIGS. 7A and 7B are sectional views showing a part of an alloy free reverse conducting GTO thyristor in which a carrier life time is partially controlled by electron beam radiation;

DETAILED DESCRIPTION OF THE PREFERRED EMBODIMENT

An embodiment of the present invention will be described below with reference to the accompanying drawings.

Figure 2:
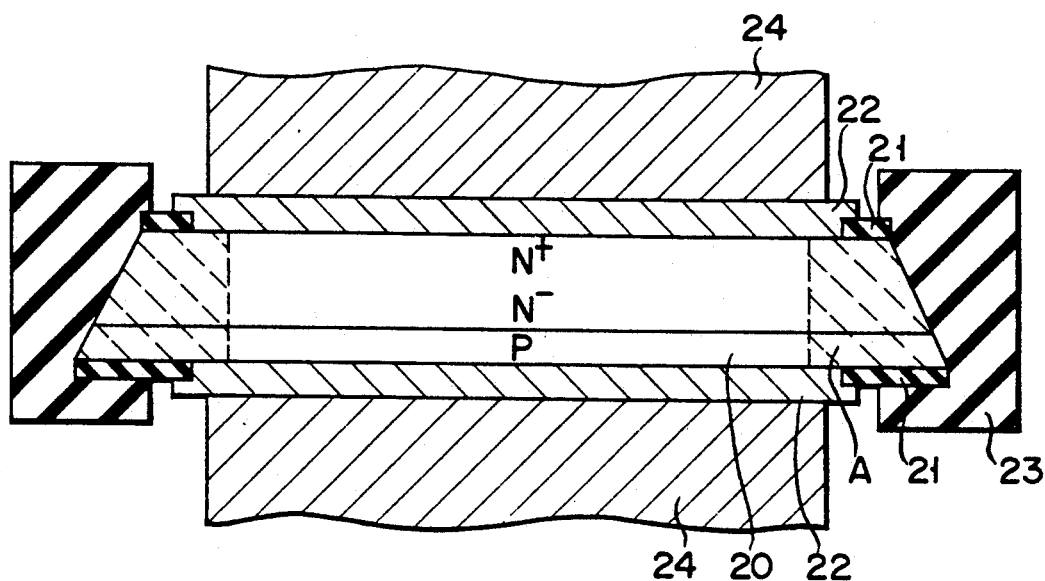
FIG. 2 is a sectional view showing a main part of an alloy free compression bonded diode according to an embodiment of the present invention.

FIG. 2 is a sectional view showing a main part of an alloy free compression bonded diode. In FIG. 2, reference numeral 20 denotes a semiconductor pellet (silicon pellet) on which a diode formed by bonding p-type, $n^-$-type, and $n^+$-type layers is formed. In the semiconductor pellet 20, oxide films ($SiO_2$ films) 21 are formed on edge portions of a first major surface of one surface side and on a second major surface of the other surface side, and anode or cathode electrodes 22 are formed on the entire surface. Encapsulating members (e.g., silicone rubber) 23 cover the edge surfaces of the semiconductor pellet 20. Electrode members 24 made of, for example, Mo are arranged in contact with the electrodes 22. Electrode posts (not shown) made of, for example, Cu compress the electrode members 24, which sandwich and compress the semiconductor pellet 20. The semiconductor pellet 20 is pressed by the electrode members 24, but is not fixed thereto. The members 24 are pressed by the electron posts, but not secured thereto. Hence, any two adjacent components contacting each other can independently contract or expand as they are cooled or heated.

In the first embodiment, a crystal defect density is distributed within the surface of the semiconductor pellet 20 so that a carrier life time of heat generating portions (edge regions of the pellet) of the semiconductor pellet, which are located outside portions where the electrode members 24 contact the electrodes 22 and cannot sufficiently conduct heat to the electrode members, is shorter than that of heat generating portions which sufficiently conduct heat to the electrode members 24. The portions which do not sufficiently conduct heat to the electrode members 24 a value larger than that of the portions which sufficiently conduct heat to the electrode members 24.

A method of forming the semiconductor pellet 20 of the compression bonded diode will be described below. A first electron beam is uniformly radiated onto the entire surface of the semiconductor pellet 20 at an acceleration voltage of 10 MeV and a dose of $5 \times 10^{11}$ cm$^{-2}$ to sufficiently decrease the carrier life time of the whole pellet, and electric characteristics of a semiconductor element close to a target can be obtained. Note that the carrier life time may be decreased by applying a radiation. Thereafter, a second electron beam having a dose ($5 \times 10^{12}$ cm$^{-2}$) which is ten times of that when the electron beam is radiated onto the entire surface is radiated onto at least edge portions of the pellet 20 and not on portions which contacts the electrode members 24 in the pellet 20 for generating heat by supplying a current to obtain a sufficient heat dissipation effect. The second election beam can be applied at a dose equal to or greater than the dose of the first beam. In this case, as a mask used for selective radiation of the electron beam, an Mo plate having a thickness of about 3 to 6 mm, or the like is used. Since electron beam-irradiated portions A (regions indicated by dotted oblique lines) to which electron beam injection (EBI) is performed are not in contact with the electrode member 24, the portions A have poor heat dissipation. However, the portions A have a crystal defect density serving as a recombination center of carriers is 1.5 or more times of heat generating portions which sufficiently conduct heat to the electrode members 24 in the pellet. Depending on elements, actual crystal defect densities are $1 \times 10^{10}$ cm$^{-3}$ and about $1 \times 10^{12}$ to $1 \times 10^{14}$ cm$^{-3}$ in heat generating portions which sufficiently conduct heat to the electrode members 24 and heat generating portions which do not sufficiently conduct heat to the electrode members 24, respectively.

In the compression bonded diode of the above embodiment, heat is effectively dissipated from the heat generating portion of the pellet 20 compressed between the electrode members 24. On the contrary, although the heat dissipation of heat generating portions (i.e., electron beam irradiated portions A) of pellet edge portions which do not contact the electrode members 24 is poor, a carrier life time of the heat generating portions is decreased compared with that of the heat generating portions contacting the electrode members 24. Therefore, a current does not easily flow through the portions not contacting the electrode members 24, and current share to these portions decreases, thereby suppressing the amount of heat generated therefrom. Thus backward breakdown voltage at a reverse recovery time can be increased. Since a temperature is increased at a position corresponding to the outer edge of the electrode member 24 due to heat transmitted from the outside, an electron beam is preferably radiated onto a small portion located inside from the outer edge of the electrode member 24.

Figure 3:
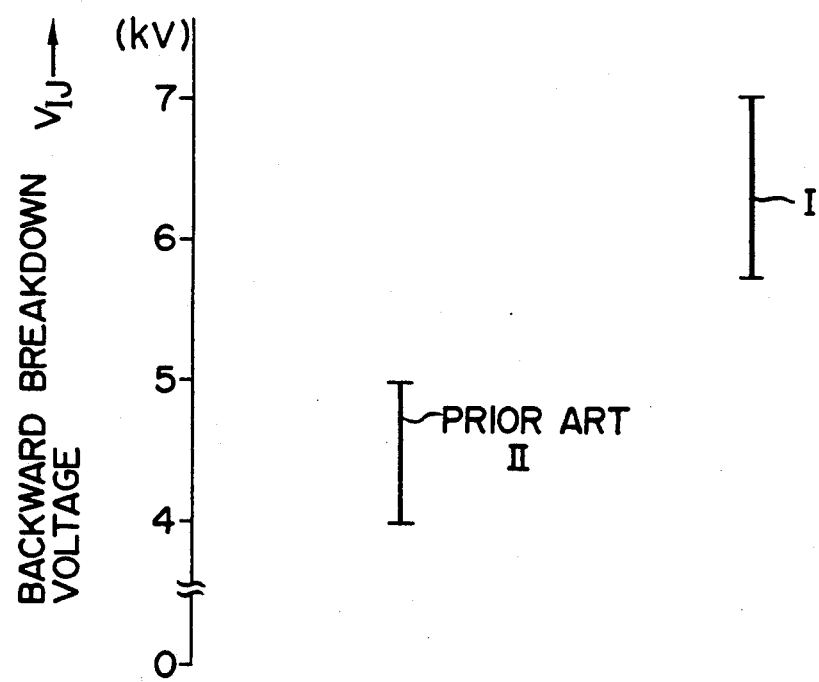
FIG. 3 is a graph showing values obtained by measuring backward breakdown voltages $V_{JJ}$ of the compression bonded diode in FIG. 2 and a conventional alloy free compression bonded diode.

FIG. 3 shows a resultant value obtained by measuring backward breakdown voltages $V_{JJ}$ of the compression bonded diode of the above embodiment (I) and a conventional alloy free compression bonded diode (II). As is apparent from FIG. 3, the backward breakdown voltage $V_{JJ}$ of the above embodiment is about 1.5 times that of the prior art.

As a method of partially controlling the carrier lifetime described above, not only an electron beam but radiation such as $\alpha$-rays can be used, or a heavy metal may be diffused. A case wherein a proton beam is used is shown in FIG. 4. In a compression bonded diode shown in FIG. 4, in place of the electron beam, a proton beam is radiated onto a pellet edge portion to form proton irradiated portions B (regions indicated by dotted oblique lines) in the direction of depth in which a carrier lifetime is locally short. According to this control for a carrier life time by radiating the proton beam, a crystal defect density can be controlled within not only the surface of the semiconductor pellet 40 but in the direction of depth. Therefore, the above-described effect can be easily obtained. The position in the direction of depth is changed depending on application elements, and not only a single element position but a plurality of element positions may be provided. As a mask for selectively radiating the proton beam, an Al plate having a thickness of about 0.2 to 1 mm can be used. This thickness is ⅛ to 1/10 that of the mask through which the electron beam is applied. When the position in the direction of depth is formed at a shallow portion having a depth of 200 μm or less from a major surface, a polyimide mask, a resist mask, a metal mask, or the like used in a conventional step can be used as a mask In this case, the mask can be formed in the same manner as other conventional masking processes for semiconductor elements Therefore, it is very useful in a manufacturing technique that a region having a high crystal defect density is formed at the shallow position having a depth of 200 μm or less.

Figure 1A:
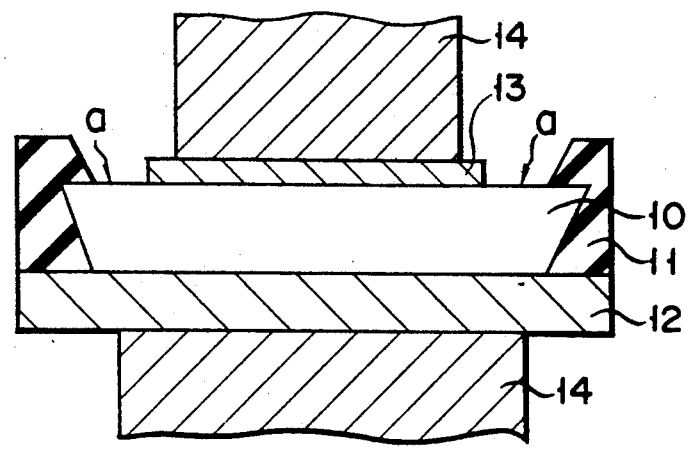
FIGS. 1A and 1B are partial sectional views schematically showing an alloy structure and an alloy free structure of conventional compression bonded diodes, respectively.
Figure 1B:
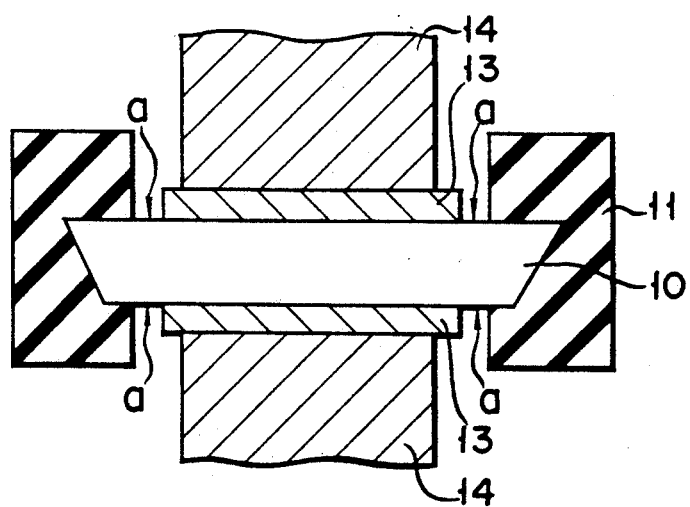

In a compression bonded diode shown in FIG. 4, the same reference numerals in FIG. 4 denote the same parts as in the compression bonded diode shown in FIG. 1.

Although a compression bonded diode is shown as an example in each of the above embodiments, the present invention can be applied to all compression bonded semiconductor devices such as composite elements, e.g., conventional thyristors, a GTO (gate turn off) thyristor, an SI (static induction) thyristor, an IGBT (insulated gate bipolar transistor), an MAGT (MOS assisted gate trigger) thyristor, an MAGTO (MOS assisted gate turn off) thyristor, a reverse blocking GTO thyristor, and a reverse conducting GTO thyristor, MCT (MOS controlled thyristor).

Figure 6:
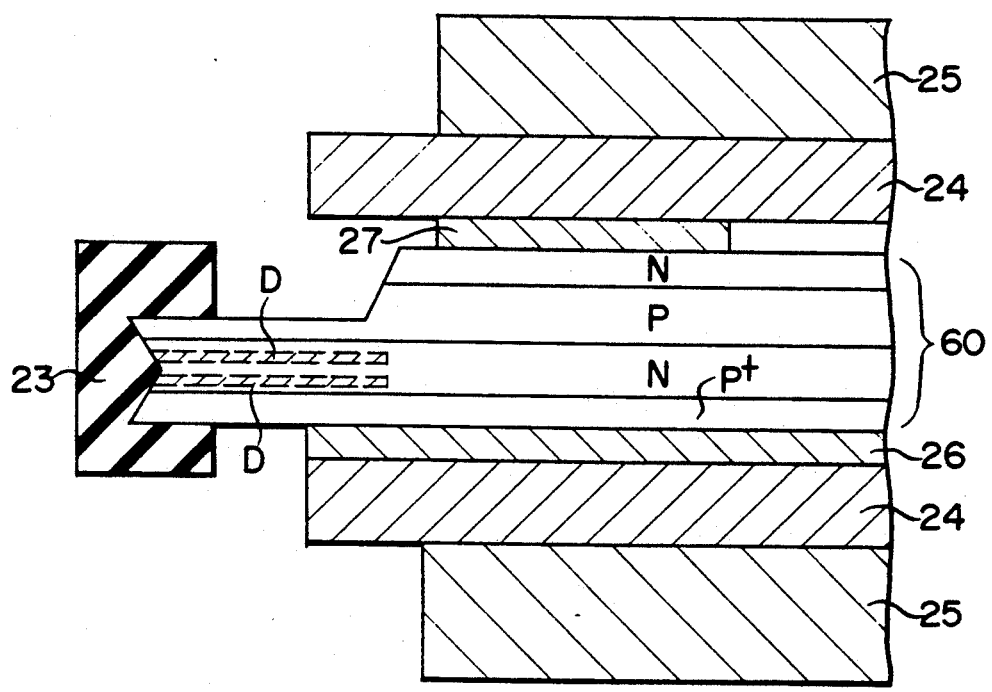
FIG. 6 is a sectional view showing a part of an alloy free reverse blocking GTO thyristor in which a carrier life time is partially controlled by proton radiation.

FIG. 5 is a sectional view showing a part of an alloy free reverse blocking GTO thyristor in which a carrier lifetime is partially controlled by electron beam radiation, and FIG. 6 is a sectional view showing a part of an alloy free reverse blocking GTO thyristor in which a carrier lifetime is partially controlled by proton beam radiation. Both semiconductor pellets 50 and 60 have a Σ-shaped double beveled edge structure.

In the case of the pellet 50, an electron beam is applied to at least the heat-generating portion which cannot transmit sufficient heat to the electron members 24, thereby forming a beam-irradiated portion C.

In the case of the pellet 60, a proton beam is applied to at least the heat-generating portion which cannot transmit sufficient heat to the electrode member, thereby forming a beam-irradiated portion D. It is possible to form a beam-irradiated portion D' of a different depth, if necessary, by varying the acceleration voltage of the proton beam. Note that reference numeral 23 denotes an encapsulating member; 24, electrode members; 25, electrode posts (e.g., Cu) arranged to compress both the surfaces of the semiconductor pellets 50 and 60 through the electrode members 24; 26, an anode electrode; and 27, a gate electrode.

According to the reverse blocking GTO thyristor, since a carrier life time is sufficiently short at, at least, pellet edge portions, a current share to the edge portions in pellet surfaces decreases, thereby suppressing heat generation. The following additional effect can be obtained. That is, when an amount of carrier injection is decreased, the turn-off time is shortened.

Figure 8:
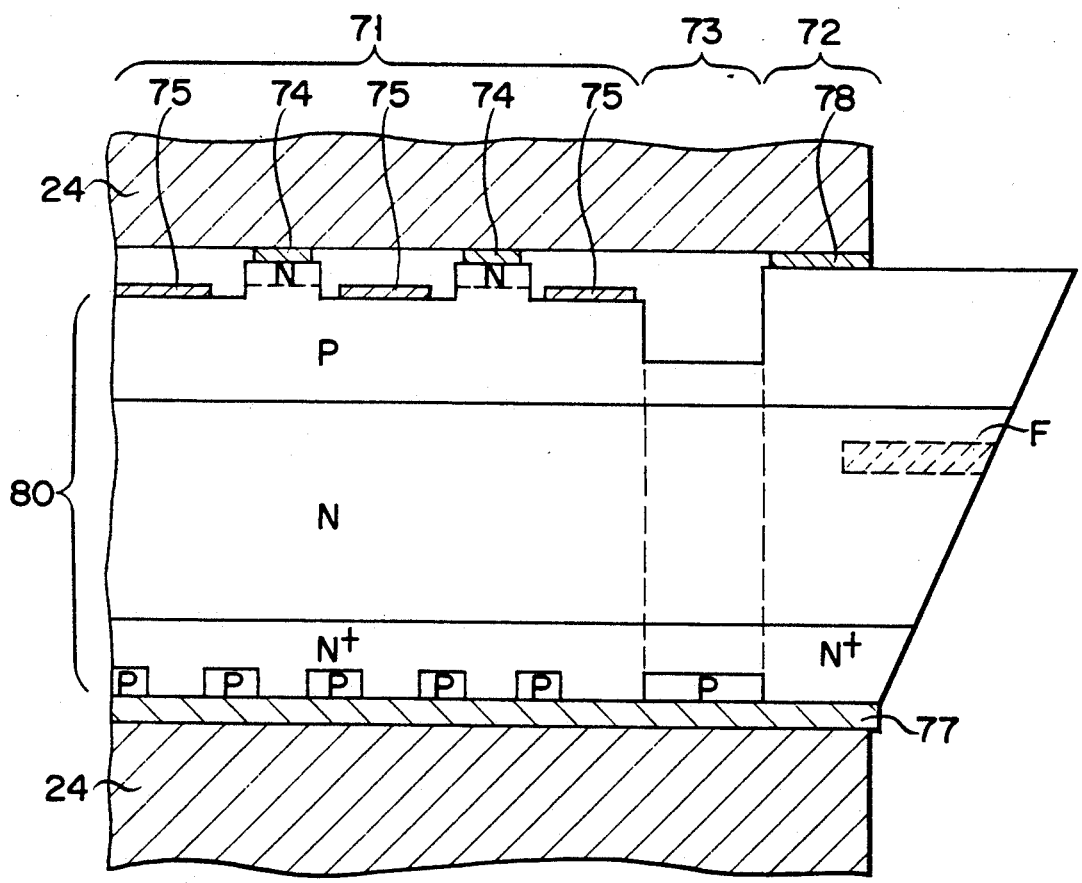
FIG. 8 is a sectional view showing a part of an alloy free reverse conducting GTO thyristor in which a carrier life time is partially controlled by proton radiation.

FIG. 7A is a sectional view showing part of an alloy free reverse conducting GTO thyristor in which a carrier lifetime is partially controlled by electron beam radiation, and FIG. 8 is a sectional view showing part of an alloy free reverse conducting GTO thyristor in which a carrier lifetime is partially controlled by proton beam radiation. A GTO thyristor 71 is formed at the center of a pellet (70, 80) as shown in FIGS. 7A and 8, and a fly-wheel diode portion 72 is formed at the edge of the pellet. An isolating region 73 is formed between the GTO thyristor 71 and the fly-wheel diode portion 72.

In the case of the pellet shown in FIG. 7A, an electron beam is applied to at least the heat-generating portion which cannot transmit sufficient heat to the electrode members 24, thereby forming a beam-irradiated portion E indicated dotted oblique lines.

In the case of the pellet shown in FIG. 8, a proton beam is applied to at least the heat-generating portion which cannot transmit sufficient heat to the electrode member 24, thereby forming a beam-irradiated portion F indicated dotted oblique lines. Note that, in the GTO portion 71, reference numerals 74 denote cathode electrodes formed on a plurality of micropatterned emitter regions; 75, gate electrodes arranged to surround the cathode electrodes 74; 78, a cathode electrode of the diode portion 72; and 77, a common anode electrode formed one surface of the pellet.

In the thyristor shown in FIG. 7A, as shown in FIG. 7B, when a part 76' of emitter patterns 76 of the semiconductor pellet is offset from a portion immediately below the electrode members 24 and connected by only the cathode electrodes 74, heat is generated even from the part 76', and the element may be destroyed. Therefore, according to the present invention, a radioactive beam is radiated onto the portion in which an emitter pattern is arranged and which is offset from the position immediately below of the electrode members 24 of the semiconductor pellet which do not sufficiently conduct heat to the electrode member 24, and destruction of the element can be prevented. In this case, the present invention is very useful.

Although a compression semiconductor device having a beveled structure is shown in the above embodiment, even when the present invention is applied to a compression bonded semiconductor device such as guard ring, RESURF, or resistive field plate (RFP) semiconductors using junction edges other than the beveled junction edge of the main junction, the same effect as described above can be obtained.

Figure 9:
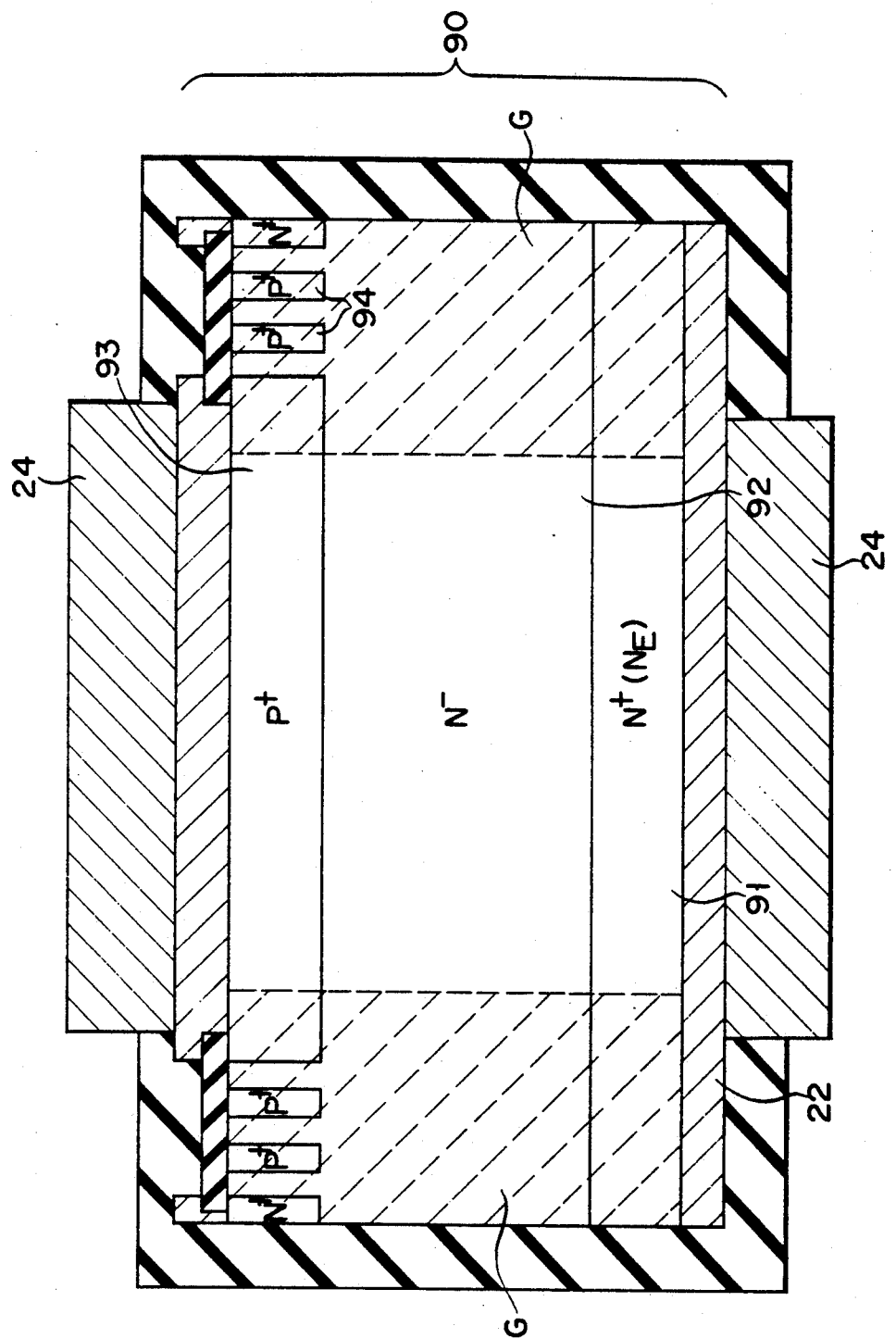
FIG. 9 is a sectional view showing a part of a compression bonded diode having a non-beveled junction edge.

FIG. 9 shows a compression bonded diode having a non-beveled junction edge. This diode comprises an $n^+$-type region 91, an $n^-$-type region 92, and a $p^+$-type region 93, where the $p^+$-type region 93 is formed on the surface of the $n^-$-type region 92 in a well form A p-n junction is exposed on the upper surface of the semiconductor pellet. In this diode, a plurality of guard rings 94 formed by $p^+$-type regions are formed on the upper surface of the semiconductor pellet to surround the p-n junction.

In this diode, in order to increase the breakdown voltage of the guard ring portions, an electron beam is radiated onto a region including the upper edge of the p-n junction of the pellet edge portion to control the carrier lifetime, thereby forming an electron beam radiated portion G.

Figure 10:
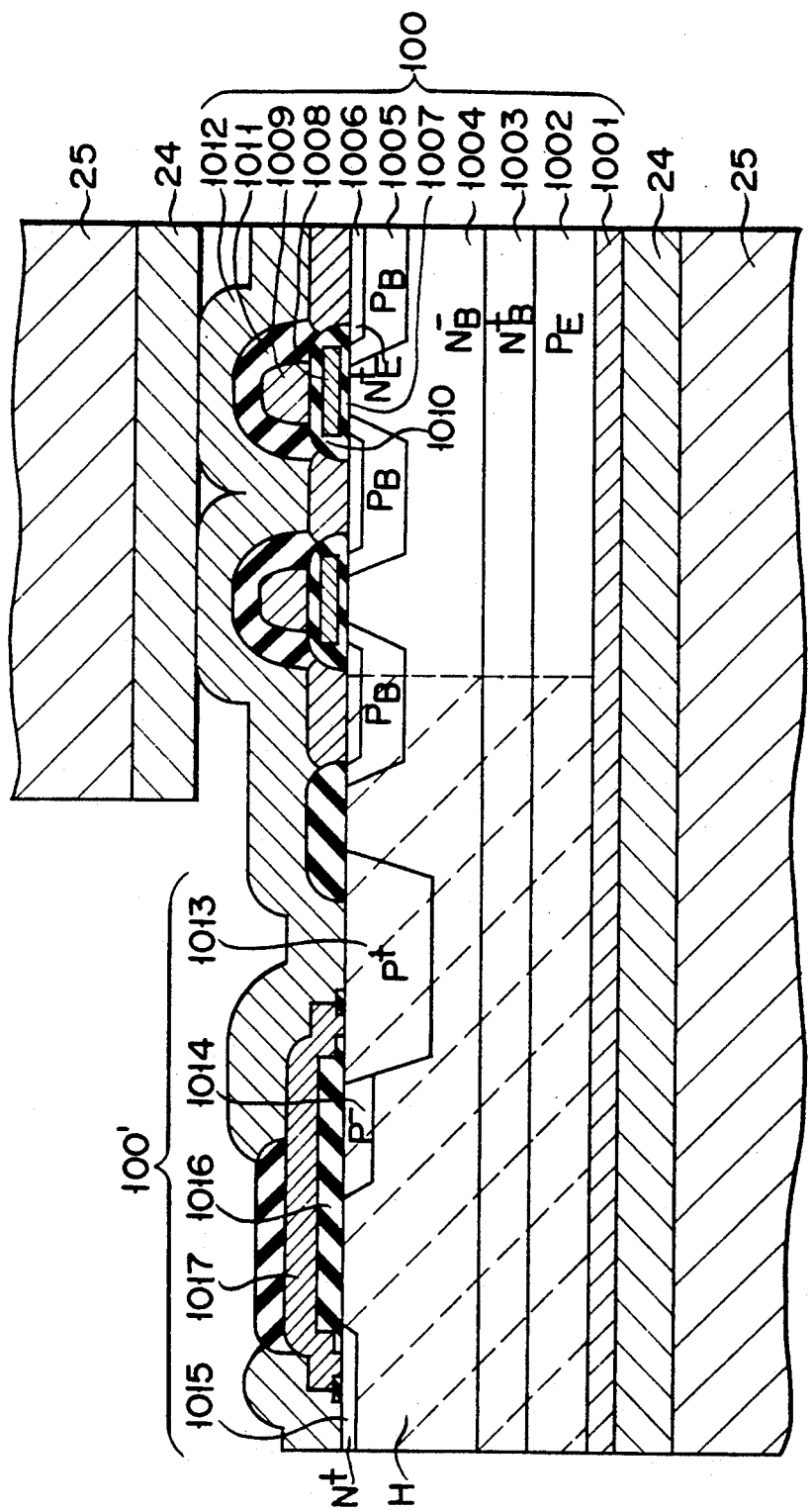
FIG. 10 is a sectional view showing a part of an alloy free MAGTO thyristor having a RESURF structure.

FIG. 10 shows a part of an alloy free MAGTO thyristor having no beveled structure but a RESURF structure at a junction edge. In this case, reference numeral 100 denotes a semiconductor pellet; 24, electrode members; and 25, electrode posts (e.g., Cu) arranged to compress both the surfaces of the semiconductor pellet 100 through the electrode members 24.

Referring to FIG. 10, reference numeral 1001 denotes an anode electrode; 1002, a p-type emitter (anode) region; 1003, $n^+$-type buffer layer; 1004, an $n^-$-type base layer; 1005, p-type base regions; 1006, an $n^+$-type emitter layer; 1007, gate insulating films; 1008, gate electrodes; 1009, base electrodes; 1010 and 1011, insulating films; 1012, cathode electrodes; 1013, a $p^+$-type region; 1014, a $p^-$-type RESURF region; 1015, an $n^+$-type stopper layer; 1016, an oxide film; and 1017, an SIPOS film.

As has been described, an RESURF structure is formed in the junction edge. The RESURF structure, which serves to increase the breakdown voltage of the junction edge, will now be described in detail. That is, the $p^+$-type region 1013 is formed outside the p-type outermost base region 1005 to have an interval, and the RESURF region 1014 serving as the $p^-$-type region 1013 is formed outside the $p^+$-type region 1013 to be in contact with it. The $n^+$-type stopper region 1015 is formed at the edge portion of the pellet 100. The insulating oxide film 1016 is formed on the semiconductor surface between the RESURF region 1014 and the stopper region 1015, and a high-resistance SIPOS layer, both the sides of which are connected to the $p^+$-type region 1013 and the stopper region 1015, is formed on the insulating oxide film 1016. Therefore, a surface electric field is controlled by an electric field corresponding to a voltage drop between the anode and the cathode in the SIPOS layer to moderate a change in the semiconductor surface electric field between the $p^+$-type region 1013 and the $n^+$-type stopper region 1015, thereby increasing the breakdown voltage of the junction edge portion. Since this structure is shallower than the above guard ring structure, it is particularly suitable for a case wherein a thin pellet such as an MAGTO thyristor is used.

In this embodiment, according to the present invention, an electron beam is radiated onto a junction edge region 100' of the pellet edge portion serving as a heat generating portion located outside the region contacting the cathode electrode 1012 directly connected to the electrode members 24 to partially control a carrier lifetime and to form an electron beam radiated portion H in a region indicated by dotted oblique lines, thereby increasing the breakdown voltage.

Figure 11:
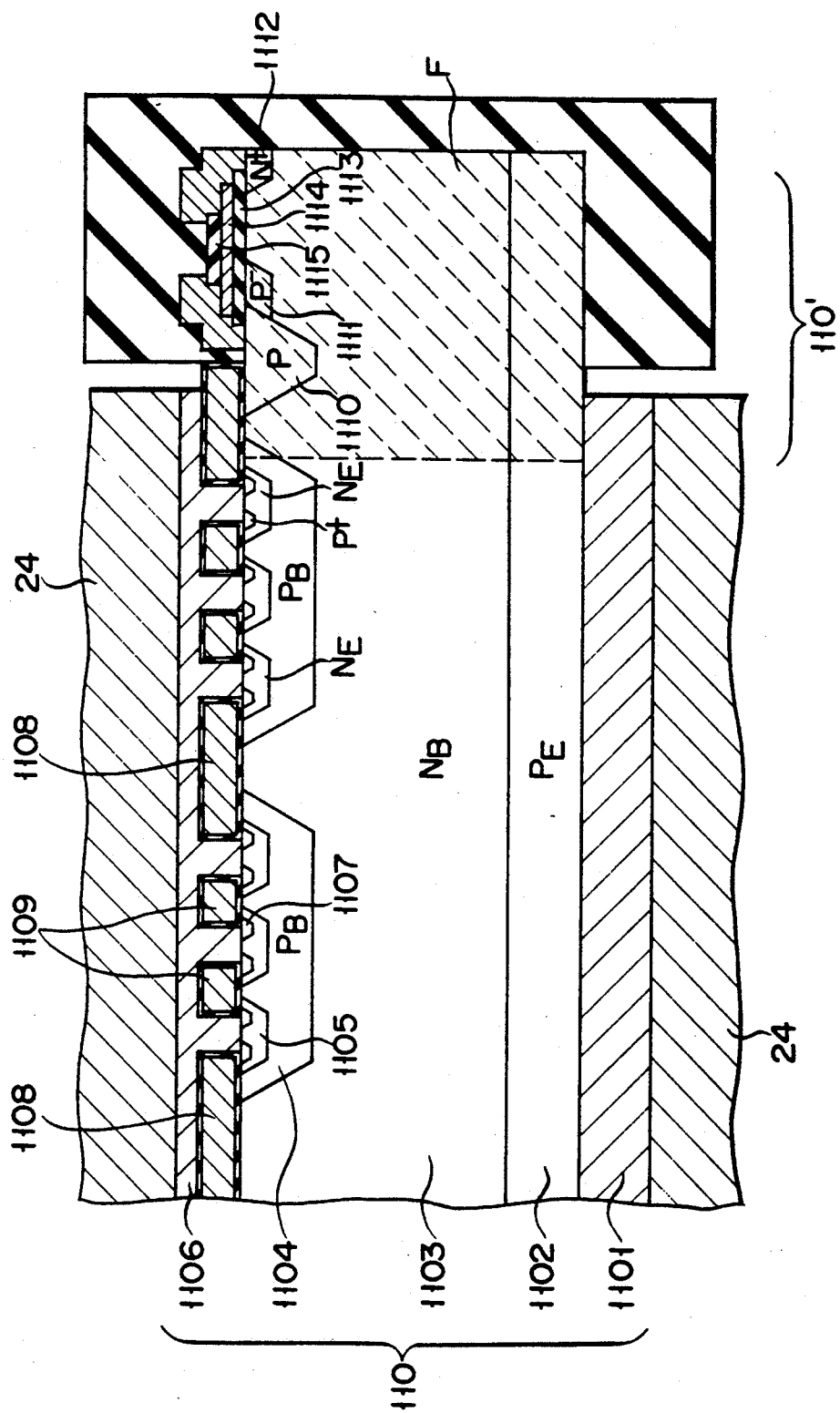
FIG. 11 is a sectional view showing a part of a MOS controlled thyristor having a RESURF structure.

FIG. 11 shows a structure of a MOS controlled thyristor (MCT) having a RESURF structure in the same manner as described above. This thyristor has the following arrangement. That is, a stacked structure consists of an anode electrode 1101, a p-type emitter region 1102, and an n-type base region 1103, and a p-type well base region 1104 and an n-type emitter region 1105 formed therein are provided in the upper surface region of the n-type base region 1103. A cathode electrode 1106 is in contact with the surface of the n-type emitter region 1105. In addition, a $p^+$-type region 1107 is formed in the n-type emitter region 1105. A gate electrode 1108 is formed on the semiconductor pellet surface between the p-type well base regions through a thin oxide film, and the gate electrode 1108 extends between surfaces of the $p^+$-type regions 1107. A gate electrode 1109 is formed on the surface between the n-type emitter regions 1105 formed in the p-type well base region 1104, and a gate electrode 1109 extends between surfaces of the $p^+$-type regions 1107 located to both the sides of the n-type emitter region 1105 in the same manner as described above.

This thyristor is turned on by applying a positive pulse to the gate electrode 1108 and is turned off by applying a negative pulse to the gate electrodes 1108 and 1109.

As in FIG. 10, a p-type region 1110, p-type RESURF region 1111, and an $n^+$-type stopper region 1112 are formed on a region near the upper surface of the edge portion of the thyristor. A high-resistance SIPOS layer 1114 having a high resistance is formed on the surface through an $SiO_2$ layer 1113. The upper surface of the SIPOS layer is covered with the CVD insulating layer 1115. Since the operation of this part is the same as in FIG. 10, a description of this operation will be omitted.

In this device, according to the present invention, an electron beam is radiated onto a junction edge region 110' of the pellet edge portion serving as a heat generating portion located outside a region contacting the cathode electrode 1106 directly connected to the electrode members 24 to partially control a carrier life time to form an electron beam radiated portion F in a region indicated by dotted oblique lines. Therefore, the breakdown voltage can be increased.

Figure 12:
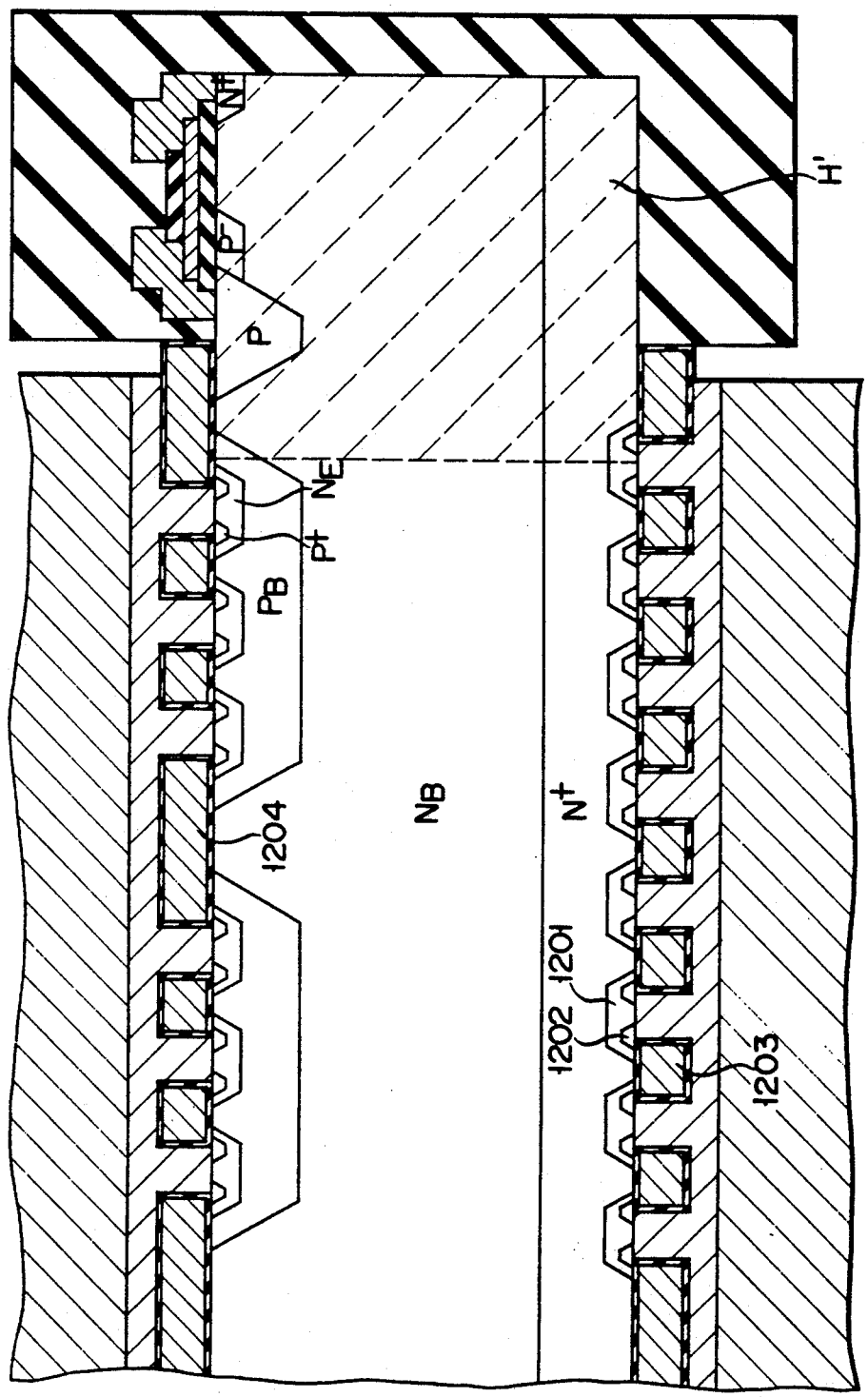
FIG. 12 is a sectional view showing a part of a double gate MOST controlled thyristor having a RESURF structure.

FIG. 12 shows an example wherein the present invention is applied to a double gate MCT having a RESURF structure.

The p-type emitter regions, which are the lowest layers of the double gate MCT, are p-type well emitter regions 1201 buried in the n+-type region. Two n+-type regions 1202 are formed in each of the p-type well emitter regions 1201. Further, gate electrode 1203 is provided on the lower major surface of the pellet, as on the upper major surface thereof. These structural features distinguish from the embodiment showed FIG. 11. Negative and positive pulse voltages are applied to the gate electrode 1204 on the upper surface and to the gate electrode 1203 on the lower surface, respectively, when the thyristor is turned off. Thus, turn-off operation can be performed at a high speed.

In this MCT, the same RESURF structure as in FIG. 11 is provided to the edge portion, and electron beam is radiated onto a region H' on which the RESURF structure is formed. Thus, the carrier lifetime can be decreased, and the breakdown voltage can be increased.

When the present invention is applied to an alloy free compression bonded semiconductor device described in the above embodiments, the present invention is effective. Even when the present invention is applied to an alloy compression semiconductor device, the same effect as described above can be obtained as a matter of course.

In the above embodiments, although a compression bonded semiconductor device having a structure using a single semiconductor pellet is described above, even when the present invention is applied to a compression bonded semiconductor device having a structure using a plurality of semiconductor pellets, the same effect as described above can be obtained.

Additional advantages and modifications will readily occur to those skilled in the art. Therefore, the invention in its broader aspects is not limited to the specific details, representative devices, and illustrated examples shown and described herein. Accordingly, various modifications may be without departing from the spirit or scope of the general inventive concept as described by the appended claims and their equivalents.

What is claimed is:

1. A compression contacted semiconductor device having an alloy-free structure, comprising:
   a semiconductor pellet including a reverse conducting gate turn off (GTO) thyristor located at a center portion thereof, a fly-wheel diode located at a peripheral portion thereof, and an isolating region located between the reverse conducting GTO thyristor and the fly-wheel diode, the semiconductor pellet having a beveled structure and having first and second major surfaces on each of which an electrode is formed;
   first and second electrode members arranged respectively on the first and second major surfaces of the semiconductor pellet; and
   first and second electrode posts between which the first and second electrode members and the semiconductor pellet are sandwiched, thus compressing the semiconductor pellet, the first and second electrode posts having a smaller width than the semiconductor pellet,
   wherein a crystal defect density of a first heat generating portion of the semiconductor pellet, which is not in contact with the first and second electrode members, is approximately 1.5 times that of a second heat generating portion of the semiconductor pellet, which is in contact with the first and second electrode members, so that a carrier lifetime of the first heat generating portion is shorter than that of the second heat generating portion.

2. The compression contacted semiconductor device according to claim 1, wherein the isolating region has a groove therein.

3. The compression contacted semiconductor device according to claim 1, wherein the crystal defect density of the first head generating portion varies according to a depth direction of the semiconductor pellet.

4. The compression contacted semiconductor device according to claim 3, wherein a position within the semiconductor pellet which has a maximum defect density of the distribution of crystal defect density controlled in the depth direction is located at a shallow portion having a depth of less than 200 $\mu$m from the first major surface.

5. A compression contacted semiconductor device having an alloy-free structure, comprising:
   a semiconductor pellet including a diode and at least one guard ring which surrounds the diode, the semiconductor pellet having first and second major surfaces on each of which a main electrode is formed;
   first and second electrode members respectively arranged on the first and second major surfaces of the semiconductor pellet; and
   first and second electrode posts between which the first and second electrode members and the semiconductor pellet are sandwiched, thus compressing the semiconductor pellet, the first and second electrode posts having a smaller width than the semiconductor pellet,
   wherein a crystal defect density of a first heat generating portion of the semiconductor pellet, which is not in contact with the first and second electrode members, is approximately 1.5 times that of a second heat generating portion of the semiconductor pellet, which is in contact with the first and second electrode members, so that a carrier lifetime of the first heat generating portion is shorter than that of the second heat generating portion.

6. The compression contacted semiconductor device according to claim 5, wherein the at least one guard ring includes an impurity diffusion region formed in one of the first and second major surfaces of the semiconductor pellet which suppresses an electric field generated in the diode.

7. A compression contacted semiconductor device having an alloy-free structure, comprising:
   a semiconductor pellet including a MOS assisted gate turn off (MAGTO) thyristor located in a central portion thereof, a RESURF structure portion located at a peripheral portion thereof, the semiconductor pellet having first and second major surfaces on each of which a main electrode is formed;
   first and second electrode members respectively arranged on the first and second major surfaces of the semiconductor pellet; and
   first and second electrode posts between which the first and second electrode members and the semiconductor pellet are sandwiched, thus compressing the semiconductor pellet, the first and second electrode posts having smaller width than the semiconductor pellet, wherein a crystal defect density of a first heat generating portion of the semiconductor pellet, which is not in contact with the first and second electrode members, is approximately 1.5 times that of a second heat generating portion of the semiconductor pellet, which is in contact with the first and second electrode members, so that a carrier lifetime of the first heat generating portion is shorter than that of the second heat generating portion.

8. The compression contacted semiconductor device according to claim 7, wherein said RESURF structure portion includes:
- a first conductivity type impurity diffusion region formed in one of the first and second major surfaces of the semiconductor pellet;
- a first conductivity type RESURF region formed adjacent to the impurity diffusion region and having a lower impurity concentration than that of the impurity diffusion region;
- a second conductivity type stopper layer formed in the one of the first and second major surfaces of the semiconductor pellet and isolated from both the impurity diffusion region and the RESURF region;
- an insulating film formed on the RESURF region and on that portion of the semiconductor pellet which is located between the RESURF region and the stopper layer; and
- an SIPOS film formed on the insulating film and connected to both the impurity diffusion region and the stopper layer.

9. A compression contacted semiconductor device having an alloy-free structure, comprising:
- a semiconductor pellet including an MOST controlled thyristor (MCT) located in a central portion thereof and a RESURF structure portion located at a peripheral portion thereof, the semiconductor pellet having first and second major surfaces on each of which a main electrode is formed;
- first and second electrode members respectively arranged on the first and second major surfaces of the semiconductor pellet; and
- first and second electrode posts between which the first and second electrode members and the semiconductor pellet are sandwiched, thus compressing said semiconductor pellet, the electrode posts having a smaller width than the semiconductor pellet,
- wherein a crystal defect density of a first heat generating portion of the semiconductor pellet, which is not in contact with the first and second electrode members, is approximately 1.5 times that of a second heat generating portion of the semiconductor pellet, which is in contact with the first and second electrode members, so that a carrier lifetime of the first heat generating portion is shorter than that of the second heat generating portion.

10. The compression contacted semiconductor device according to claim 9, wherein said RESURF structure portion includes:
- a first-conductivity type impurity diffusion region formed in one of the first and second major surfaces of the semiconductor pellet;
- a first conductivity type RESURF region formed adjacent to the impurity diffusion region and having a lower impurity concentration than that of the impurity diffusion region;
- a second conductivity type stopper layer formed in the one of the first and second major surfaces of the semiconductor pellet and isolated from both the impurity diffusion region and the RESURF region;
- an insulating film formed on the RESURF region and on that portion of the semiconductor pellet which is located between the RESURF region and the stopper layer; and
- an SIPOS film formed on the insulating film and connected to both the impurity diffusion region and the stopper layer.

11. A compression contacted semiconductor device having an alloy-free structure, comprising:
- a semiconductor pellet including a double-gate MOS controlled thyristor located in a central portion thereof and a RESURF structure portion located at a peripheral portion thereof, the semiconductor pellet having first and second major surfaces on each of which a main electrode is formed;
- first and second electrode members respectively arranged on the first and second major surfaces of the semiconductor pellet; and
- first and second electrode posts between which the first and second electrode members and the semiconductor pellet are sandwiched, thus compressing the semiconductor pellet, the first and second electrode posts having width smaller than the semiconductor pellet,
- wherein a crystal defect density of a first heat generating portion of the semiconductor pellet, which is not in contact with the first and second electrode members, is approximately 1.5 times that of a second heat generating portion of the semiconductor pellet, which is in contact with the first and second electrode members, so that a carrier lifetime of the first heat generating portion is shorter than that of the second heat generating portion.

12. The compression contacted semiconductor device according to claim 11, wherein the RESURF structure portion includes:
- a first-conductivity type impurity diffusion region formed in one of the first and second major surfaces of the semiconductor pellet;
- a first conductivity type RESURF region formed adjacent to the impurity diffusion region and having a lower impurity concentration than that of the impurity diffusion region;
- a second conductivity type stopper layer formed in the one of the first and second major surfaces of the semiconductor pellet and isolated from both the impurity diffusion region and the RESURF region;
- an insulating film formed on the RESURF region and on that portion of the semiconductor pellet which is located between the RESURF region and the stopper layer; and
- an SIPOS film formed on the insulating film and connected to both the impurity diffusion region and the stopper layer.

* * * * *